US011101820B1

(12) United States Patent
Lin et al.

(10) Patent No.: US 11,101,820 B1
(45) Date of Patent: Aug. 24, 2021

(54) MEMORY CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Shih-Jia Zeng, Hsinchu (TW); Yu-Cheng Hsu, Yilan County (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/889,808

(22) Filed: Jun. 2, 2020

(30) Foreign Application Priority Data

Apr. 14, 2020 (TW) ................................ 109112487

(51) Int. Cl.
| | |
|---|---|
| *H03M 13/01* | (2006.01) |
| *G11C 29/12* | (2006.01) |
| *G11C 29/52* | (2006.01) |
| *H03M 13/11* | (2006.01) |
| *H03M 13/15* | (2006.01) |

(52) U.S. Cl.
CPC ..... *H03M 13/015* (2013.01); *G11C 29/12005* (2013.01); *G11C 29/52* (2013.01); *H03M 13/1105* (2013.01); *H03M 13/1575* (2013.01)

(58) Field of Classification Search
CPC .......... H03M 13/015; H03M 13/1105; H03M 13/1575; G11C 29/12005; G11C 29/52
See application file for complete search history.

(56) References Cited

U.S. PATENT DOCUMENTS

| | | | | |
|---|---|---|---|---|
| 9,529,666 | B2 * | 12/2016 | Lin | G06F 11/1012 |
| 9,715,429 | B1 * | 7/2017 | Lin | G11C 16/10 |
| 2014/0223246 | A1 * | 8/2014 | Kim | G06F 11/1048 |
| | | | | 714/718 |
| 2016/0306693 | A1 * | 10/2016 | Lin | G11C 29/44 |
| 2016/0350179 | A1 * | 12/2016 | Lin | H03M 13/2909 |
| 2019/0279723 | A1 * | 9/2019 | Hsiao | G11C 16/26 |
| 2019/0304546 | A1 * | 10/2019 | Hsiao | G11C 16/26 |
| 2019/0391914 | A1 * | 12/2019 | Hsiao | G11C 16/34 |
| 2020/0105350 | A1 * | 4/2020 | Kim | G11C 16/26 |
| 2020/0201569 | A1 * | 6/2020 | Hsiao | G06F 3/0604 |
| 2020/0341679 | A1 * | 10/2020 | Hsiao | G11C 11/5642 |

\* cited by examiner

*Primary Examiner* — Kyle Vallecillo
(74) *Attorney, Agent, or Firm* — JCIPRNET

(57) ABSTRACT

A memory control method for a rewritable non-volatile memory module is provided according to an exemplary embodiment of the disclosure. The method includes: sending a first read command sequence which indicates a reading of a first physical unit by using a first read voltage level to obtain first data; decoding the first data; sending a second read command sequence which indicates a reading of the first physical unit by using a second read voltage level to obtain second data; decoding the second data with assistance information to improve a decoding success rate of the second data if the second read voltage level meets a first condition or the second data meets a second condition; and decoding the second data without the assistance information if the second read voltage level does not meet the first condition and the second data does not meet the second condition.

21 Claims, 12 Drawing Sheets

MEMORY CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 109112487, filed on Apr. 14, 2020. The entirety of the above-mentioned patent application is hereby incorporated by reference herein and made a part of this specification.

BACKGROUND

Technical Field

The present disclosure relates to a memory management technology, and in particular, to a memory control method, a memory storage device and a memory control circuit unit.

Description of Related Art

Digital cameras, mobile phones and MP3 players have been developed very rapidly in recent years, and the demands of customers for storage media also have increased rapidly. A rewritable non-volatile memory module (for example, a flash memory) is very suitable for being installed in the above exemplified various portable multimedia devices thanks to the characteristics of non-volatile data, power saving, small volume, no mechanical structure, and the like.

Some types of memory storage devices support both hard bit mode decoding and soft bit mode decoding. Hard bit mode decoding has a faster decoding speed, while soft bit mode decoding has a higher decoding success rate. In hard bit mode decoding, whenever the decoding fails, the read voltage level used to read the memory cell in the rewritable non-volatile memory module can be adjusted with reference to the retry table, and the adjusted read voltage level can be used to reread data (also called hard bit). Once the retry count of the hard bit mode decoding exceeds a default value, the soft bit mode decoding can be executed. In soft bit mode decoding, more read voltage levels can be used to read memory cells to obtain additional information (also known as soft bits) related to the hard bits to improve the decoding success rate by importing the additional information.

However, for the rewritable non-volatile memory module with severe voltage shifting, the decoding success rate of hard bit mode decoding is low, resulting in the system needing to spend a lot of time waiting for hard bit mode decoding to be finished and then decoding data in the soft bit mode decoding.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

A memory control method, a memory storage device and a memory control circuit unit are provided according to exemplary embodiments of the disclosure, which can improve a decoding success rate of data in a hard bit mode decoding.

A memory control method for a rewritable non-volatile memory module is provided according to an exemplary embodiment of the disclosure, wherein the rewritable non-volatile memory module includes a plurality of physical units, and the memory control method includes: sending a first read command sequence which indicates a reading of a first physical unit among the physical units by using a first read voltage level to obtain first data; decoding the first data; sending a second read command sequence which indicates a reading of the first physical unit by using a second read voltage level to obtain second data if a decoding of the first data is failed, wherein the second read voltage level is different from the first read voltage level; decoding the second data with assistance information to improve a decoding success rate of the second data if the second read voltage level meets a first condition or the second data meets a second condition; and decoding the second data without the assistance information if the second read voltage level does not meet the first condition and the second data does not meet the second condition.

A memory storage device including a connection interface unit, a rewritable non-volatile memory module and a memory control circuit unit is provided according to an exemplary embodiment of the disclosure. The connection interface unit is configured to be coupled to a host system. The rewritable non-volatile memory module comprises a plurality of physical units. The memory control circuit unit is coupled to the connection interface unit and the rewritable non-volatile memory module. The memory control circuit unit is configured to send a first read command sequence which indicates a reading of a first physical unit among the physical units by using a first read voltage level to obtain first data. The memory control circuit unit is further configured to decode the first data. The memory control circuit unit is further configured to send a second read command sequence which indicates a reading of the first physical unit by using a second read voltage level to obtain second data if a decoding of the first data is failed, wherein the second read voltage level is different from the first read voltage level. The memory control circuit unit is further configured to decode the second data with assistance information to improve a decoding success rate of the second data if the second read voltage level meets a first condition or the second data meets a second condition. The memory control circuit unit is further configured to decode the second data without the assistance information if the second read voltage level does not meet the first condition and the second data does not meet the second condition.

A memory control circuit unit for controlling a memory storage device including a rewritable non-volatile memory module is provided according to an exemplary embodiment of the disclosure. The rewritable non-volatile memory module includes a plurality of physical units. The memory control circuit unit includes a host interface, a memory interface, a decoding circuit and a memory management circuit. The host interface is configured to be coupled to a host system. The memory interface is configured to be coupled to the rewritable non-volatile memory module. The memory management circuit is coupled to the host interface, the memory interface and the decoding circuit. The memory management circuit is configured to send a first read command sequence which indicates a reading of a first physical unit among the physical units by using a first read voltage level to obtain first data. The decoding circuit is configured to decode the first data. The memory management circuit is further configured to send a second read command sequence which indicates a reading of the first physical unit by using a second read voltage level to obtain second data if a decoding of the first data is failed, wherein the second read voltage level is different from the first read voltage level. The decoding circuit is further configured to decode the second data with assistance information to improve a decoding success rate of the second data if the second read voltage level meets a first condition or the second data meets a second condition. The decoding circuit is further configured to decode the second data without the assistance information if the second read voltage level does not meet the first condition and the second data does not meet the second condition.

Based on the above, after reading the first physical unit at least once and experiencing at least one decoding failure, the assistance information that can increase the decoding success rate of data is only used when certain conditions are met, not unconditionally used in each rereading and decoding. In this way, on the premise of trying to increase the decoding success rate of data in hard bit mode decoding, it can avoid reducing the decoding success rate due to excessive use or adjustment of the assistance information.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
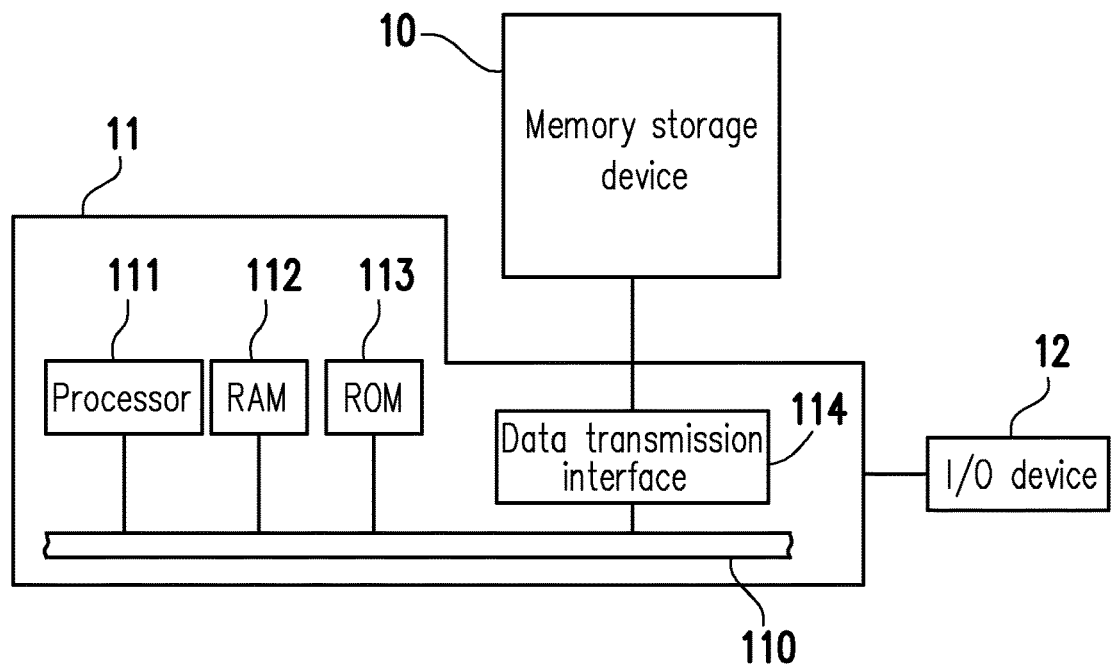
FIG. 1 is a schematic diagram of a host system, a memory storage device and an input/output (I/O) device illustrated according to an exemplary embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (also known as a memory storage system) includes a rewritable non-volatile memory module and a controller (also known as a control circuit). Generally, the memory storage device is used together with a host system to enable the host system to write data to or read data from the memory storage device.

Figure 2:
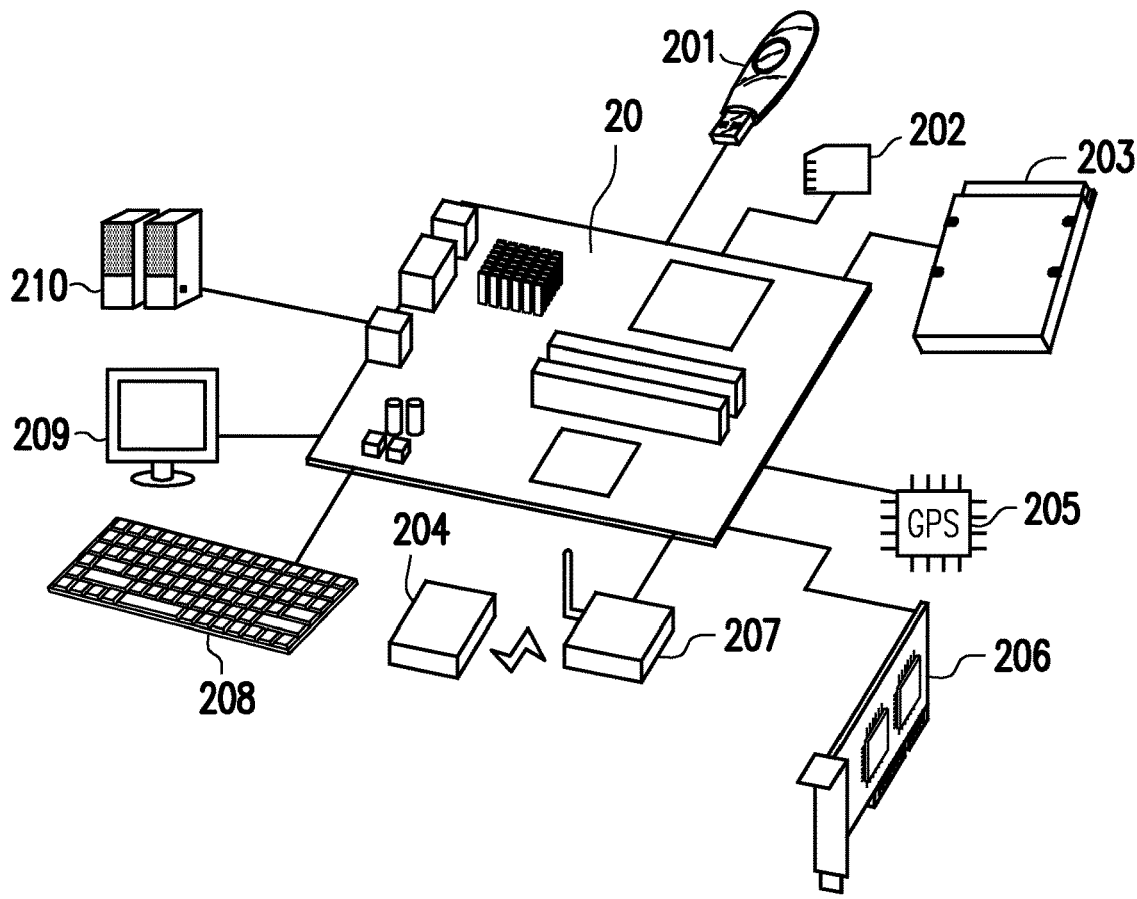
FIG. 2 is a schematic diagram of a host system, a memory storage device and an Input/Output (I/O) device illustrated according to an exemplary embodiment of the present disclosure.

FIG. 1 is a schematic diagram of a host system, a memory storage device and an input/output (I/O) device illustrated according to an exemplary embodiment of the present disclosure. FIG. 2 is a schematic diagram of a host system, a memory storage device and an I/O device illustrated according to an exemplary embodiment of the present disclosure.

Referring to FIGS. 1 and 2, the host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For example, the host system 11 may store data to the memory storage device 10 or read data from the memory storage device 10 via the data transmission interface 114. In addition, the host system 11 is coupled to the I/O device 12 through the system bus 110. For example, the host system 11 may transmit an output signal to the I/O device 12 or receive an input signal from the I/O device 12 via the system bus 110.

In the present exemplary embodiment, the processor 111, the RAM 112, the ROM 113 and the data transmission interface 114 may be arranged on a motherboard 20 of the host system 11. There may be one or more data transmission interfaces 114. The motherboard 20 may be coupled to the memory storage device 10 via the data transmission interface 114 in a wired or wireless way. The memory storage device 10 may be, for example, a flash drive 201, a memory card 202, a solid state drive (SSD) 203, or a wireless memory storage device 204. The wireless memory storage device 204 may be, for example, a memory storage device based on various wireless communication technologies, such as a near field communication (NFC) memory storage device, a wireless fidelity (WiFi) memory storage device, a Bluetooth memory storage device or a Bluetooth low energy memory storage device (such as iBeacon). In addition, the motherboard 20 may also be coupled to various I/O devices such as a global positioning system (GPS) module 205, a network interface card 206, a wireless transmission device 207, a keyboard 208, a screen 209 and a speaker 210 through the system bus 110. For example, in an exemplary embodiment, the motherboard 20 may access the wireless memory storage device 204 via the wireless transmission device 207.

Figure 3:
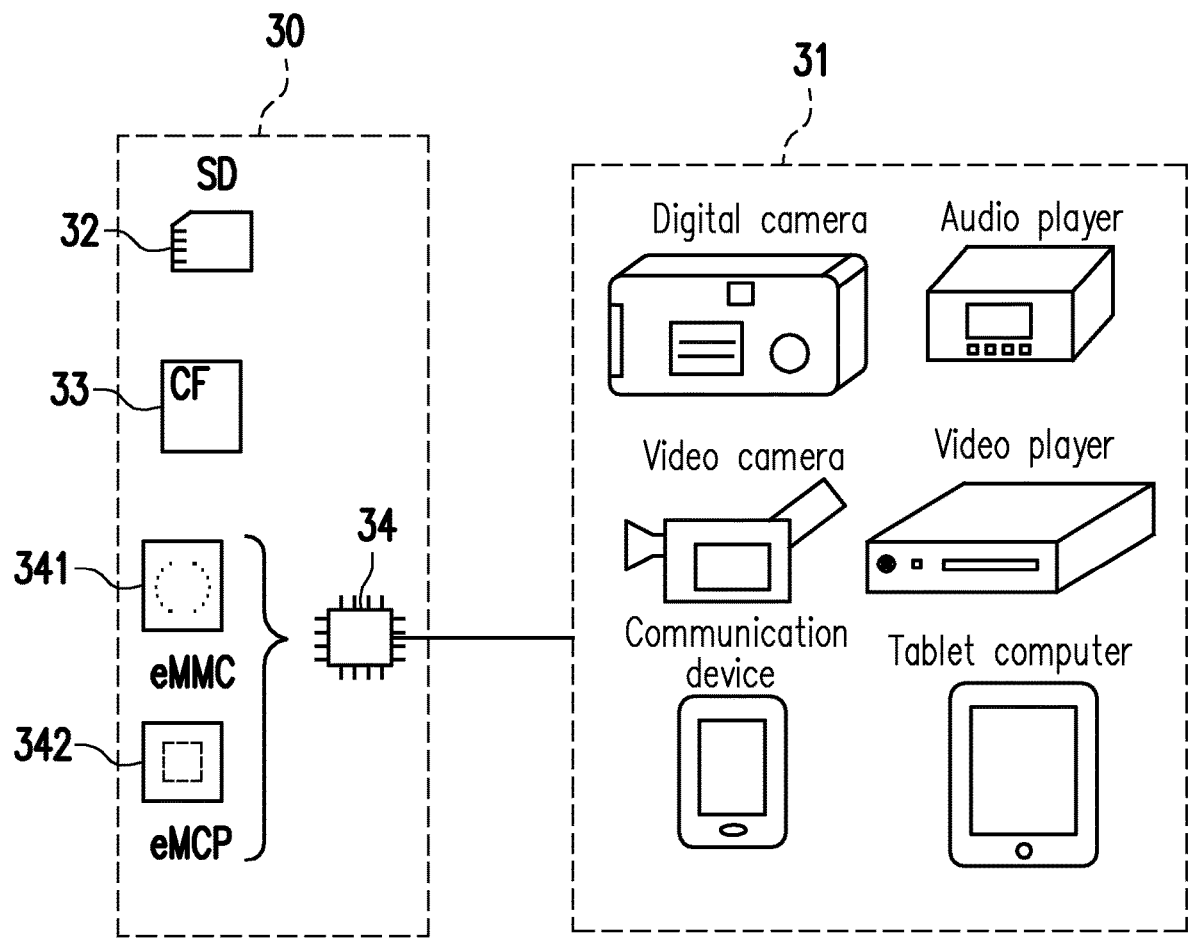
FIG. 3 is a schematic diagram of a host system and a memory storage device illustrated according to an exemplary embodiment of the present disclosure.

In an exemplary embodiment, the host system provided may be any system that may substantially cooperate with the memory storage device to store data. In the above exemplary embodiment, the host system is illustrated by a computer system, however, FIG. 3 is a schematic diagram of a host system and a memory storage device illustrated according to an exemplary embodiment of the present disclosure. Referring to FIG. 3, in another exemplary embodiment, the host system 31 may also be a digital camera, a video camera, a communication device, an audio player, a video player, or a tablet computer, or another system, and the memory storage device 30 may be various non-volatile memory storage devices such as a secure digital (SD) card 32, a compact flash (CF) card 33 or an embedded storage device 34 used by the host system. The embedded storage device 34 includes various types of embedded storage devices for directly coupling a memory module to a substrate of the host system, such as an embedded multi media card (eMMC) 341 and/or an embedded multi chip package (eMCP) storage device 342.

Figure 4:
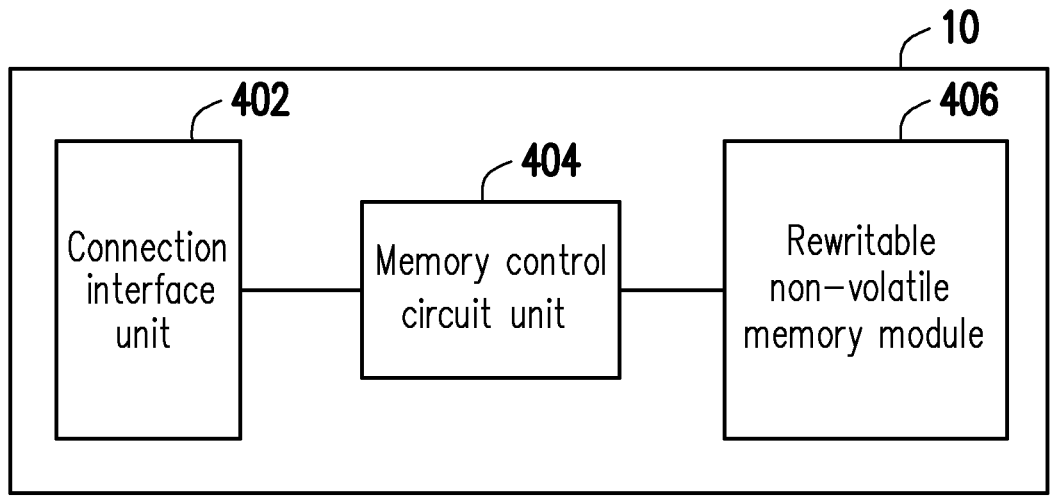
FIG. 4 is a general block diagram of a memory storage device illustrated according to an exemplary embodiment of the present disclosure.

FIG. 4 is a general block diagram of a memory storage device illustrated according to an exemplary embodiment of the present disclosure. Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. The memory storage device 10 may communicate with the host system 11 via the connection interface unit 402. In the present exemplary embodiment, the connection interface unit 402 is compatible with the serial advanced technology attachment (SATA) standard. However, it must be understood that the present disclosure is not limited thereto, and the connection interface unit 402 may also conform to the parallel advanced technology attachment (PATA) standard, the institute of electrical and electronic engineers (IEEE) 1394 standard, the high-speed peripheral component interconnect (PCI) express standard, the universal serial bus (USB) standard, the SD interface standard, the ultra high speed-I (UHS-I) interface standard, the ultra high speed II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard or other suitable standards. The connection interface unit 402 may be packaged in a chip with the memory control circuit unit 404, or the connection interface unit 402 may be arranged outside a chip including the memory control circuit unit 404.

The memory control circuit unit 404 is configured to execute a plurality of logic gates or control commands implemented in a hardware or firmware form, and perform write, read and erase operations and the like on data in the rewritable non-volatile memory module 406 according to a command of the host unit 11.

The rewritable non-volatile memory module 406 is coupled to the memory control circuit unit 404 and is configured to store data written by the host system 11. The rewritable non-volatile memory module 406 may be a single level cell (SLC) NAND-type flash memory module (i.e., a flash memory module with one memory cell that may store one bit), a multi level cell (MLC) NAND-type flash memory module (i.e., a flash memory module with one memory cell that may store 2 bits), a triple level cell (TLC) NAND-type flash memory module (i.e., a flash memory module with one memory cell that may store 3 bits), a quad level cell (QLC) NAND-type flash memory module (i.e., a flash memory module with one memory cell that may store 4 bits), other flash memory modules, or other memory modules with the same characteristic.

Each of the memory cells in the rewritable non-volatile memory module 406 stores one or more bits in response to a change in voltage (hereinafter also referred to as a threshold voltage). Specifically, there is a charge trapping layer between a control gate of each memory cell and a channel. By applying a write voltage to the control gate, the amount of electrons in the charge trapping layer may be changed, and then the threshold voltage of the memory cell is changed. This operation of changing the threshold voltage of the memory cell is also known as "writing data to the memory cell" or "programming the memory cell". As the threshold voltage changes, each of the memory cells of the rewritable non-volatile memory module 406 has a plurality of storage states. By applying a read voltage to determine a specific storage state of a specific memory cell, one or more bits stored by the memory cell may be obtained.

In the present exemplary embodiment, the memory cells of the rewritable non-volatile memory module 406 may constitute a plurality of physical programming units, and these physical programming units may constitute a plurality of physical erasing units. Specifically, the memory cells on the same word line may constitute one or more physical programming units. If each memory cell may store 2 or more bits, the physical programming units on the same word line would be at least classified into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally speaking, in the MLC NAND-type flash memory, the write speed of the lower physical programming unit may be greater than that of the upper physical programming unit, and/or the reliability of the lower physical programming unit may be higher than that of the upper physical programming unit.

In the present exemplary embodiment, the physical programming unit is a programmed smallest unit. That is, the physical programming unit is the smallest unit for writing data. For example, the physical programming unit may be a physical page or a physical sector. If the physical programming units are the physical pages, the physical programming units may include a data bit region and a redundancy bit region. The data bit region contains a plurality of physical sectors configured to store user data, and the redundancy bit region is configured to store system data (such as an error correcting code and other management data). In the present exemplary embodiment, the data bit region contains 32 physical sectors, and one physical sector has a size of 512 bytes (B). However, in other exemplary embodiments, the data bit region may also contain 8, 16, or more or fewer physical sectors, and the size of each of the physical sectors may be larger or smaller. On the other hand, the physical erasing units are the smallest units for erasing. That is, each physical erasing unit contains the smallest number of memory cells to be erased together. For example, the physical erasing units may be physical blocks.

Figure 5:
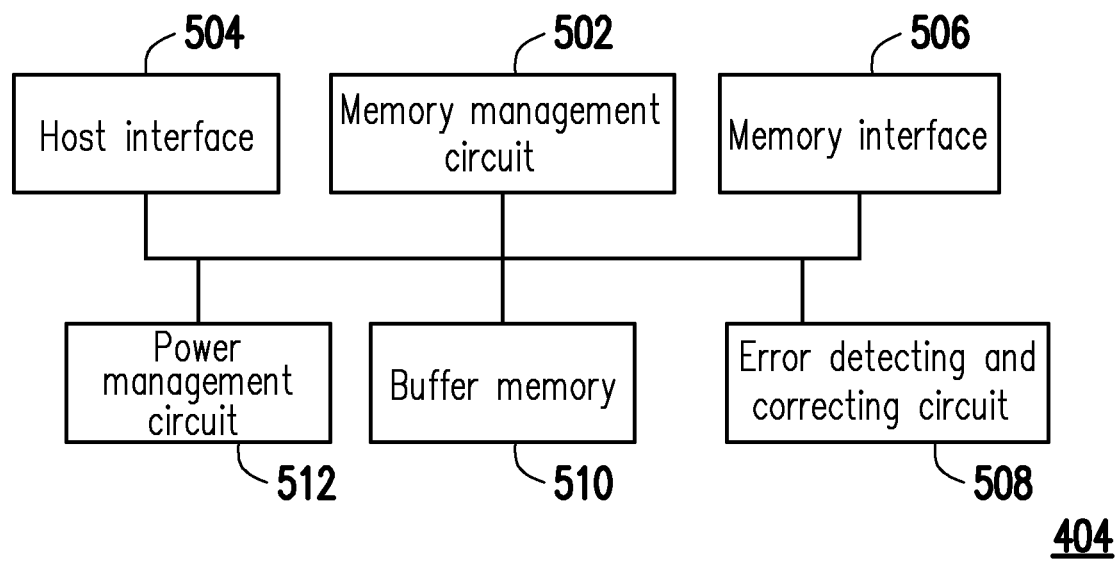
FIG. 5 is a general block diagram of a memory control circuit unit illustrated according to an exemplary embodiment of the present disclosure.

FIG. 5 is a general block diagram of a memory control circuit unit illustrated according to an exemplary embodiment of the present disclosure. Referring to FIG. 5, the memory control circuit unit 404 includes a memory management circuit 502, a host interface 504, a memory interface 506 and an error detecting and correcting circuit 508.

The memory management circuit 502 is configured to control the overall operation of the memory control circuit unit 404. Specifically, the memory management circuit 502 has a plurality of control commands, and when the memory storage device 10 is in operation, these control commands are executed to perform operations such as writing, reading and erasing of the data. The following description of the operation of the memory management circuit 502 is equivalent to the description of the operation of the memory control circuit unit 404.

In the present exemplary embodiment, the control commands of the memory management circuit 502 are implemented in a firmware form. For example, the memory management circuit 502 has a microprocessor unit (not shown) and an ROM (not shown), and these control commands are recorded into the ROM. When the memory storage device 10 is in operation, these control commands would be executed by the microprocessor unit to perform the operations such as writing, reading and erasing of data.

In another exemplary embodiment, the control commands of the memory management circuit 502 may also be stored in a specific region (such as a system region specially configured to store system data in the memory module) of the rewritable non-volatile memory module 406 in a program code form. In addition, the memory management circuit 502 has a microprocessor unit (not shown), an ROM (not shown) and an RAM (not shown). Particularly, the ROM has a boot code, and when the memory control circuit unit 404 is enabled, the microprocessor unit would firstly execute the boot code to load the control commands stored in the rewritable non-volatile memory module 406 into the RAM of the memory management circuit 502. Then, the microprocessor unit may execute these control commands to perform the operations such as writing, reading and erasing of the data.

In addition, in another exemplary embodiment, the control commands of the memory management circuit 502 may also be implemented in a hardware form. For example, the memory management circuit 502 includes a microcontroller, a memory cell management circuit, a memory write circuit, a memory read circuit, a memory erase circuit and a data processing circuit. The memory cell management circuit, the memory write circuit, the memory read circuit, the memory erase circuit and the data processing circuit are coupled to the microcontroller. The memory cell management circuit is configured to manage memory cells or memory cell groups of the rewritable non-volatile memory module 406. The memory write circuit is configured to send a write command sequence to the rewritable non-volatile memory module 406 to write data into the rewritable non-volatile memory module 406. The memory read circuit is configured to send a read command sequence to the rewritable non-volatile memory module 406 to read data from the rewritable non-volatile memory module 406. The memory erase circuit is configured to send an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence and the erase command sequence may each include one or more program codes or command codes and are configured to instruct the rewritable non-volatile memory module 406 to perform the corresponding operations such as writing, reading and erasing. In an exemplary embodiment, the memory management circuit 502 may also send other types of command sequences to the rewritable non-volatile memory module 406 to instruct the latter to perform corresponding operations.

The host interface 504 is coupled to the memory management circuit 502. The memory management circuit 502 may communicate with the host system 11 through the host interface 504. The host interface 504 may be configured to receive and identify commands and data transmitted by the host system 11. For example, the commands and data transmitted by the host system 11 may be transmitted to the memory management circuit 502 through the host interface 504. In addition, the memory management circuit 502 may transmit data to the host system 11 via the host interface 504. In the present exemplary embodiment, the host interface 504 is compatible with the SATA standard. However, it must be understood that the present disclosure is not limited thereto, and the host interface 504 may be compatible with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 506 is coupled to the memory management circuit 502 and is configured to access the rewritable non-volatile memory module 406. That is, data to be written to the rewritable non-volatile memory module 406 is converted into a format acceptable to the rewritable non-volatile memory module 406 via the memory interface 506. Specifically, if the memory management circuit 502 is to access the rewritable non-volatile memory module 406, the memory interface 506 would transmit corresponding command sequences. For example, these command sequences may include a write command sequence that instructs writing of data, a read command sequence that instructs reading of data, an erase command sequence that instructs erasing of data and corresponding command sequences that instruct various memory operations (such as changing of a read voltage level or performing of a garbage collection operation). These command sequences are generated, for example, by the memory management circuit 502 and transmitted to the rewritable non-volatile memory module 406 via the memory interface 506. These command sequences may include one or more signals, or data on a bus. These signals or data may include command codes or program codes. For example, the read command sequence would include information such as a read identification code and memory address.

The error detecting and correcting circuit (also referred to as a decoding circuit) 508 is coupled to the memory management circuit 502 and is configured to perform an error detecting and correcting operation to ensure the correctness of data. Specifically, when the memory management circuit 502 receives a write command from the host system 11, the error detecting and correcting circuit 508 may generate a corresponding error correcting code (ECC) and/or an error detecting code (EDC) for data corresponding to the write command, and the memory management circuit 502 would write the data corresponding to the write command and the corresponding ECC and/or EDC to the rewritable non-volatile memory module 406. Then, when the memory management circuit 502 reads the data from the rewritable non-volatile memory module 406, the ECC and/or the EDC corresponding to the data may be read at the same time, and the error detecting and correcting circuit 508 would perform an error detecting and correcting operation on the read data according to the ECC and/or EDC.

It is noted that, the error detecting and correcting circuit 508 may support a hard bit mode decoding operation and a soft bit mode decoding operation. The decoding speed of the hard bit mode decoding operation is faster than the decoding speed of the soft bit mode decoding operation. However, the decoding success rate of the soft bit mode decoding operation is higher than the decoding success rate of the hard bit mode decoding operation.

In an exemplary embodiment, the memory control circuit unit 404 further includes a buffer memory 510 and a power management circuit 512. The buffer memory 510 is coupled to the memory management circuit 502 and is configured to temporarily store the data and commands from the host system 11 or the data from the rewritable non-volatile memory module 406. The power management circuit 512 is coupled to the memory management circuit 502 and is configured to control a power supply of the memory storage device 10.

In an exemplary embodiment, the rewritable non-volatile memory module 406 of FIG. 4 is also known as a flash memory module, and the memory control circuit unit 404 is also known as a flash memory controller configured to control a flash memory module. In an exemplary embodiment, the memory management circuit 502 of FIG. 5 is also known as a flash memory management circuit.

Figure 6:
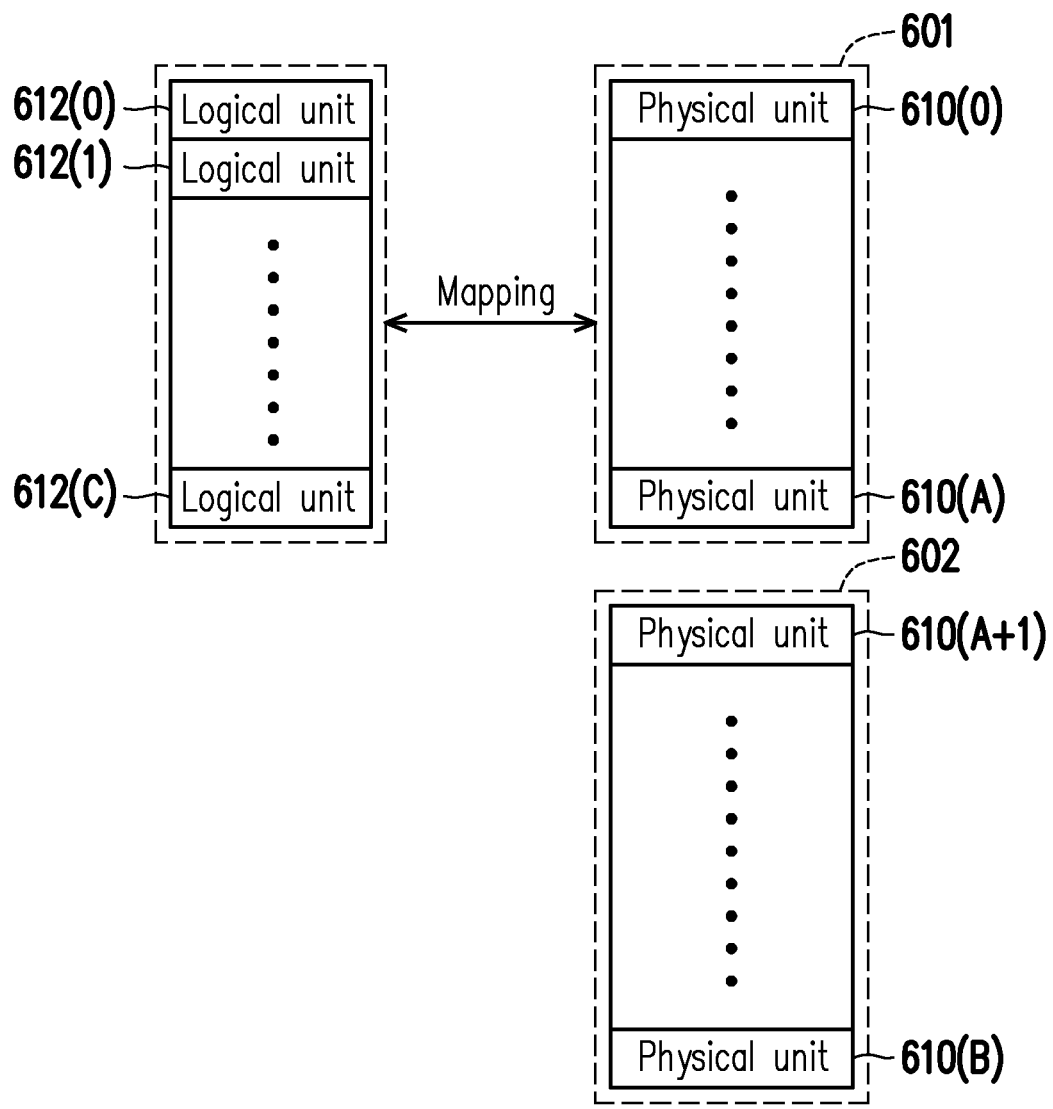
FIG. 6 is a schematic diagram of management of a rewritable non-volatile memory module illustrated according to an exemplary embodiment of the present disclosure.

FIG. 6 is a schematic diagram of management of a rewritable non-volatile memory module illustrated according to an exemplary embodiment of the present disclosure. Referring to FIG. 6, the memory management circuit 502 may logically group physical units 610(0) to 610(B) of the rewritable non-volatile memory module 406 into a storage region 601 and a replacement region 602. The physical units 610(0) to 610(A) in the storage region 601 are configured to store data, and the physical units 610(A+1) to 610(B) in the replacement region 602 are configured to replace damaged physical units in the storage region 601. For example, if data read from a certain physical unit contains too many errors and cannot be corrected, the physical unit would be considered as a damaged physical unit. It should be noted that if there is no available physical erasing unit in the replacement region 602, the memory management circuit 502 may possibly declare the entire memory storage device 10 to be in a write protect state, and no data can be written again.

In the present exemplary embodiment, each physical unit refers to a physical programming unit. However, in another exemplary embodiment, a physical unit may also refer to a physical address or a physical erasing unit, or may consist of a plurality of continuous or non-continuous physical addresses. The memory management circuit 502 may assign logical units 612(0) to 612(C) to map the physical units 610(0) to 610(A) in the storage region 601. In the present exemplary embodiment, each logical unit refers to a logical address. However, in another exemplary embodiment, a logical unit may also refer to a logical programming unit or a logical erasing unit, or may consist of a plurality of continuous or non-continuous logical addresses. In addition, each of the logical units 612(0) to 612(C) may be mapped to one or more physical units.

The memory management circuit 502 may record a mapping relation (also known as a logical-to-physical address mapping relation) between the logical unit and the physical unit in at least one logical-to-physical address mapping table. When the host system 11 is to read data from the memory storage device 10 or write data to the memory storage device 10, the memory management circuit 502 may perform a data access operation on the memory storage device 10 according to the logical-to-physical address mapping table.

It is noted that in the following description, some terms may be replaced with corresponding abbreviations for ease of reading (see Table 1).

TABLE 1

| | |
|---|---|
| rewritable non-volatile memory module | RNVM module |
| memory management circuit | MMC |

TABLE 1-continued

| | |
|---|---|
| error detecting and correcting circuit | EDCC |
| physical unit | PU |
| read voltage level | RVL |

Figure 7:
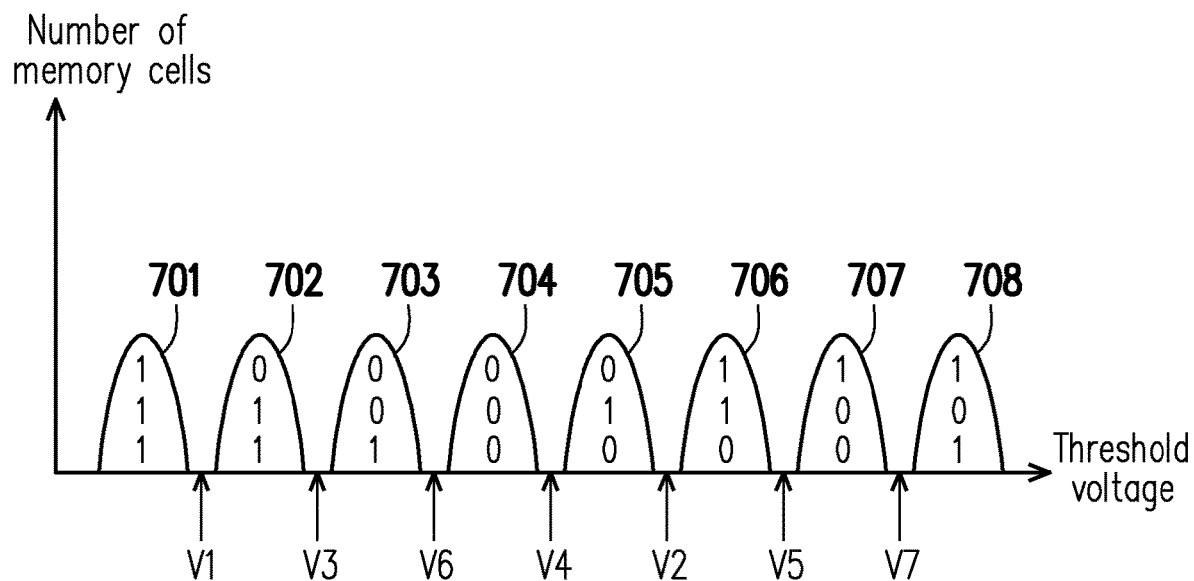
FIG. 7 is a schematic diagram of threshold voltage distribution of memory cells illustrated according to an exemplary embodiment of the present disclosure.

FIG. 7 is a schematic diagram of threshold voltage distribution of memory cells illustrated according to an exemplary embodiment of the present disclosure. Referring to FIG. 7, taking the TLC NAND flash memory module as an example, after programming a certain PU (also called first PU), the threshold voltage of each programmed memory cell in the first PU may belong to one of the states 701-708. For example, if multiple programmed memory cells are used to store bits "111", "011", "001", "000", "010", "110", "100" and "101", then these memory cells may belong to states 701-708 respectively. When data stored in these memory cells is to be read, RVLs V1-V7 may be applied to the first PU. According to the conduction state of each memory cell in the first PU in response to the RVLs V1-V7, the state to which each memory cell belongs can be identified, and then the data stored in each memory cell can be obtained.

It should be noted that in another exemplary embodiment, if an SLC NAND flash memory module, an MLC NAND flash memory module, or a QLC NAND flash memory module is used as an example, the number of bits stored in each of the memory cells may be different. Therefore, there may be more or fewer states in the threshold voltage distribution of the memory cells, which is not limited by the present invention.

Figure 8:
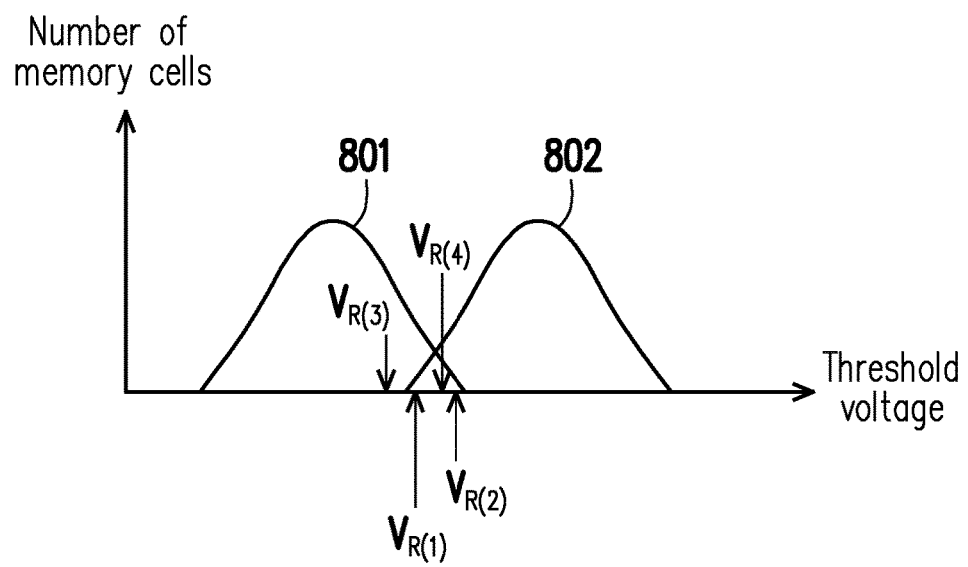
FIG. 8 is a schematic diagram of threshold voltage distribution and read voltage levels used in hard bit mode decoding illustrated according to an exemplary embodiment of the present disclosure.

FIG. 8 is a schematic diagram of threshold voltage distribution and RVLs used in hard bit mode decoding illustrated according to an exemplary embodiment of the present disclosure. Please refer to FIG. 8, states 801 and 802 may be any two adjacent states in FIG. 7. Affected by the use environment (such as environment temperature) and/or the degree of use (such as use time), there may be overlaps between the states 801 and 802, so that data read from this overlapping area has a high probability of including error bits.

In the hard bit mode decoding, the MMC 502 may send a read command sequence, which instructs the RNVM module 406 to use a RVL (e.g., RVL $V_{R(1)}$) to read the first PU. The MMC 502 can obtain data reflecting the read result of this RVL. The EDCC 508 can decode this data. If the decoding of this data is successful, the successfully decoded data can be output (for example, transmitted to the host system). If the decoding of this data fails, the MMC 502 may send another read command sequence, which instructs the RNVM module 406 to use another RVL (such as RVL $V_{R(2)}$) to read the first PU. The MMC 502 can obtain data reflecting the read result of this RVL. The EDCC 508 can decode this data.

By analogy, in the hard bit mode decoding, before the retry count exceeds a retry threshold value, whenever a decoding fails, the next different RVL (such as RVL $V_{R(3)}$ and/or RVL $V_{R(4)}$) can be used to read the first PU again, and the read data can be decoded. In addition, the information of the RVLs used in the hard bit decoding mode may be recorded in a retry table. According to this retry table, multiple RVLs (such as RVL $V_{R(1)}$-$V_{R(4)}$) can be used sequentially in the hard bit mode decoding.

In an exemplary embodiment, if the number of retry count of the hard bit decoding mode exceeds this retry threshold value, it means that the decoding capability of the hard bit mode decoding cannot correct all errors in the read data. Therefore, the EDCC 508 can enter the soft bit mode decoding to improve the decoding ability for data.

Figure 9:
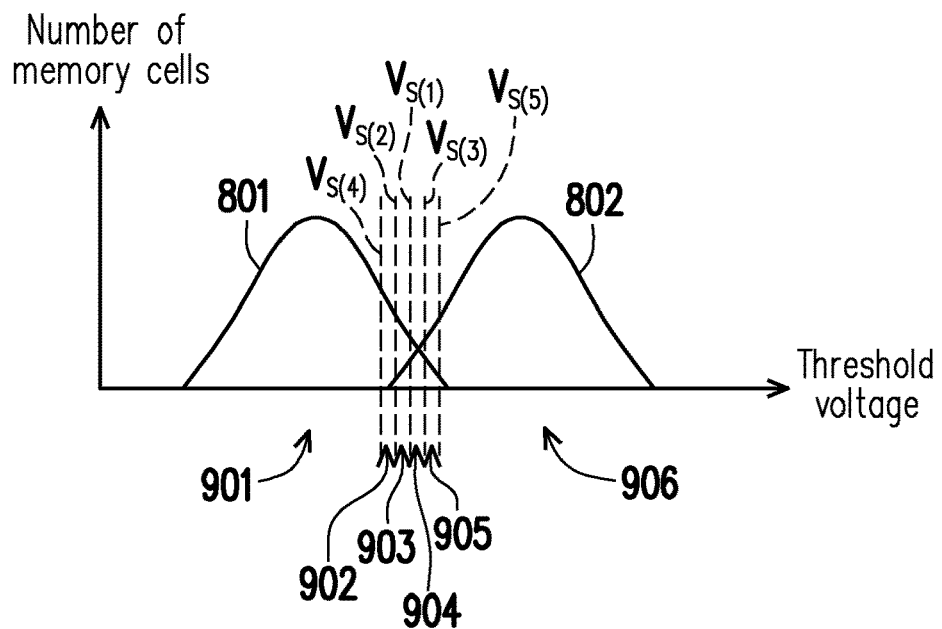
FIG. 9 is a schematic diagram of threshold voltage distribution and read voltage levels used in soft bit mode decoding illustrated according to an exemplary embodiment of the present disclosure.

FIG. 9 is a schematic diagram of threshold voltage distribution and RVLs used in soft bit mode decoding illustrated according to an exemplary embodiment of the present disclosure. Please refer to FIG. 9, in the soft bit mode decoding, the MMC 502 can send multiple read command sequences, which instruct the RNVM module 406 to use multiple RVLs (e.g., RVL $V_{S(1)}$-$V_{S(5)}$) to read the first PU. The MMC 502 can obtain data reflecting the read results of these RVLs. According to the reading results of these RVLs, the threshold voltage of each memory cell can be identified as belonging to one of a plurality of voltage intervals (e.g., voltage intervals 901-906) and given corresponding reliability information. Taking Log Likelihood Ratio (LLR) as an example of reliability information, the value of the reliability information corresponding to the voltage interval to the left is smaller.

After determining the reliability information corresponding to each voltage interval according to the reading results of these RVLs, according to the voltage interval to which each memory cell belongs, the EDCC 508 can use the corresponding reliability information to decode data read from these memory cell by using a specific RVL. For example, this specific RVL is also known as a sign RVL and is used to initially determine whether the bit read from each memory cell is "0" or "1". Taking FIG. 9 as an example, the specific RVL may be RVL $V_{S(1)}$.

From another perspective, in the hard bit mode decoding of FIG. 8, each time a RVL is applied, data reflecting the read result of this RVL will be decoded once. However, in the soft bit mode decoding of FIG. 9, after successively applying multiple RVLs, the data reflecting the reading result of the specific RVL will be decoded once.

Traditionally, each decoding in the hard bit mode decoding only decodes the data obtained by applying the RVL each time, unlike the soft bit decoding mode that dynamically generates or updates the reliability information which is available to increase the decoding success rate. Therefore, the decoding success rate of hard bit mode decoding is generally low. In the case that the threshold voltage of the memory cell is seriously shifted, the system may need to wait until all RVLs in the hard bit mode decoding have been used before entering the soft bit mode decoding, resulting in longer decoding time.

In an exemplary embodiment, in the hard bit mode decoding, the MMC 502 may send a read command sequence (also called first read command sequence), which indicates a reading of the first PU by using a RVL (also called first RVL) to obtain data (also called first data). The first data can reflect the reading results of the first RVL for each memory cell in the first PU. The EDCC 508 can decode the first data. If the decoding of the first data is successful, the successfully decoded first data can be output.

If the decoding of the first data fails, the MMC 502 may send another read command sequence (also called second read command sequence), which indicates a reading of the first PU by using another RVL (also called second RVL) to obtain another data (also called second data). The second data can reflect the read results of the second RVL for each memory cell in the first PU. The second RVL is different from the first RVL. Taking FIG. 8 as an example, the first RVL and the second RVL can be any two of the RVLs $V_{R(1)}$-$V_{R(4)}$.

After obtaining the second data, the MMC 502 can determine whether the second RVL meets a specific condition (also called first condition) and/or whether the second data meets a specific condition (also called second condition). If the second RVL meets the first condition or the second data meets the second condition, the EDCC 508 may use assistance information to decode the second data. This assistance information can be used to increase the decoding success rate of second data. For example, the assistance information may include dynamically determined reliability information corresponding to multiple voltage intervals (similar to the dynamically determined reliability information in the exemplary embodiment of FIG. 9). After importing this assistance information to decode second data, even in the hard bit mode decoding, the decoding success rate of second data can be significantly improved.

However, if the second RVL does not meet the first condition and the second data does not meet the second condition, the EDCC 508 may decode the second data without using this assistance information. For example, if the second RVL does not meet the first condition and the second data does not meet the second condition, the EDCC 508 can maintain a default decoding operation in the hard bit mode decoding to decode the second data without additional reference to the dynamically determined reliability information. In other words, by moderately and correctly using the assistance information in the hard bit mode decoding, it is possible to avoid the excessive use or adjustment of the assistance information which leads decreasing of the decoding success rate of the data.

In an exemplary embodiment, the MMC 502 may determine whether the second RVL meets the first condition according to whether the second RVL is within a specific voltage range. In an exemplary embodiment, if the second RVL is within the specific voltage range, the MMC 502 may determine that the second RVL meets the first condition. In an exemplary embodiment, if the second RVL is not within the specific voltage range, the MMC 502 may determine that the second RVL does not meet the first condition.

Figure 10:
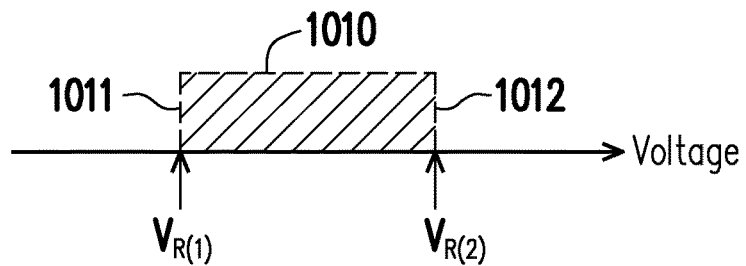
FIG. 10 is a schematic diagram of specific voltage range illustrated according to an exemplary embodiment of the present disclosure.

FIG. 10 is a schematic diagram of specific voltage range illustrated according to an exemplary embodiment of the present disclosure. Referring to FIGS. 8 and 10, in an example embodiment, after using the RVLs $V_{R(1)}$ and $V_{R(2)}$ to read the first PU and unsuccessfully decode the data, the MMC 502 can determine a specific voltage range 1010 according to the voltage levels $V_{R(1)}$ and $V_{R(2)}$. For example, the MMC 502 may determine a boundary 1011 of the specific voltage range 1010 according to RVL $V_{R(1)}$ and determine a boundary 1012 of the specific voltage range 1010 according to RVL $V_{R(2)}$. In other words, the specific voltage range 1010 includes the voltage range between the boundaries 1011 and 1012.

Figure 11:
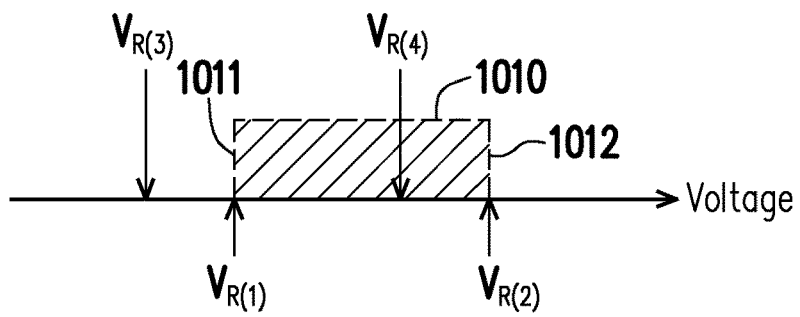
FIG. 11 is a schematic diagram of specific voltage range and read voltage levels illustrated according to an exemplary embodiment of the present disclosure.

FIG. 11 is a schematic diagram of specific voltage range and RVLs illustrated according to an exemplary embodiment of the present disclosure. Referring to FIG. 11, in an exemplary embodiment, after determining the specific voltage range 1010, it is assumed that RVL $V_{R(3)}$ is used to read the first PU (that is, the RVL $V_{R(3)}$ is the second RVL). In response to the RVL $V_{R(3)}$ not being within the specific voltage range 1010, the MMC 502 may determine that the RVL $V_{R(3)}$ does not meet the first condition. In response to the RVL $V_{R(3)}$ not meeting the first condition, the MMC 502 may instruct the EDCC 508 to decode the data (i.e., the second data) reflecting the reading result of the RVL $V_{R(3)}$ without referring to additional assistance information.

Alternatively, in another exemplary embodiment, after specific voltage range 1010 is determined, it is assumed that RVL $V_{R(4)}$ is used to read the first PU (that is, the RVL $V_{R(4)}$ is the second RVL). In response to the RVL $V_{R(4)}$ being within the specific voltage range 1010, the MMC 502 may determine that the RVL $V_{R(4)}$ meets the first condition. In response to the RVL $V_{R(4)}$ meeting the first condition, the MMC 502 may instruct the EDCC 508 to decode the data (i.e., the second data) that reflects the reading result of the RVL $V_{R(4)}$ with referring to the additional assistance information.

In an exemplary embodiment, the MMC 502 can obtain a syndrome value of the second data. This syndrome value is related to the bit error rate of the second data. For example, the MMC 502 (or the EDCC 508) may perform a parity check operation on the second data to obtain the syndrome value of the second data. The MMC 502 can determine whether the second data meets the second condition according to whether the syndrome value is less than a default value. For example, if the syndrome value is less than the default value, the MMC 502 may determine that the second data meets the second condition. If the syndrome value is not less than the default value, the MMC 502 can determine that the second data does not meet the second condition.

Figures 12, 13:
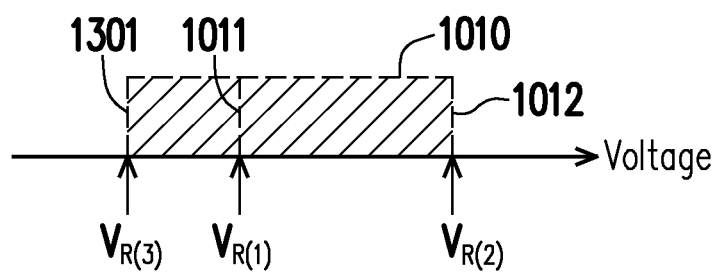
FIG. 12 is a schematic diagram of parity check operation illustrated according to an exemplary embodiment of the present disclosure.
FIG. 13 is a schematic diagram of updating specific voltage range illustrated according to an exemplary embodiment of the present disclosure.

FIG. 12 is a schematic diagram of parity check operation illustrated according to an exemplary embodiment of the present disclosure. Referring to FIG. 12, in an exemplary embodiment, it is assumed that the second data includes a codeword 1202. The code word 1202 contains multiple bits $V_0$-$V_8$. The MMC 502 (or the EDCC 508) can multiply a matrix (also called parity check matrix, labeled as H) 1201 by the code word 1202 to obtain a syndrome vector 1203. The syndrome vector 1203 contains multiple syndromes $S_0$-$S_7$. If there are no error bits in the code word 1202, the syndromes $S_0$-$S_7$ should all be bit "0". The more bits "1" in the syndromes $S_0$-$S_7$ (or the less bits "0" in the syndromes $S_0$-$S_7$), the more error bits in codeword 1202 may be.

In an exemplary embodiment, the MMC 502 may determine the syndrome value of the second data according to the sum of the syndromes $S_0$-$S_7$. For example, the syndrome value of the second data can reflect the sum of the syndromes $S_0$-$S_7$. For example, the syndrome value of the second data can be positively related to the sum of the syndromes $S_0$-$S_7$. If the more bits "1" in the syndromes $S_0$-$S_7$ (or the less bits "0" in the syndromes $S_0$-$S_7$), the larger the syndrome value of the second data.

In an exemplary embodiment, the MMC 502 may update the boundary of the specific voltage range according to the second RVL to expand the coverage of the specific voltage range. In an exemplary embodiment, the MMC 502 may determine whether to update the boundary of the specific voltage range according to whether the second RVL is within the specific voltage range or a relative relation between the second RVL and the specific voltage range. In this way, the probability that the RVL used in the subsequent hard bit mode decoding meets the first condition can be improved.

FIG. 13 is a schematic diagram of updating specific voltage range illustrated according to an exemplary embodiment of the present disclosure. Please refer to FIG. 13, assuming that RVL $V_{R(3)}$ is not within the specific voltage range 1010. After using the RVL $V_{R(3)}$ to read the first PU, the MMC 502 can update a boundary of the specific voltage range 1010 from a boundary 1011 corresponding to the RVL $V_{R(1)}$ to a boundary 1301 corresponding to the RVL $V_{R(3)}$, so as to expand the coverage of a specific voltage range 1010.

In an exemplary embodiment, after determining that the second RVL meets the first condition or the second data meets the second condition, the MMC 502 may identify multiple voltage intervals according to at least parts of multiple RVLs, such as the first RVL and the second RVL, used in the hard bit mode decoding. Then, the MMC 502 may determine the assistance information according to the identified multiple voltage intervals.

Figure 14:
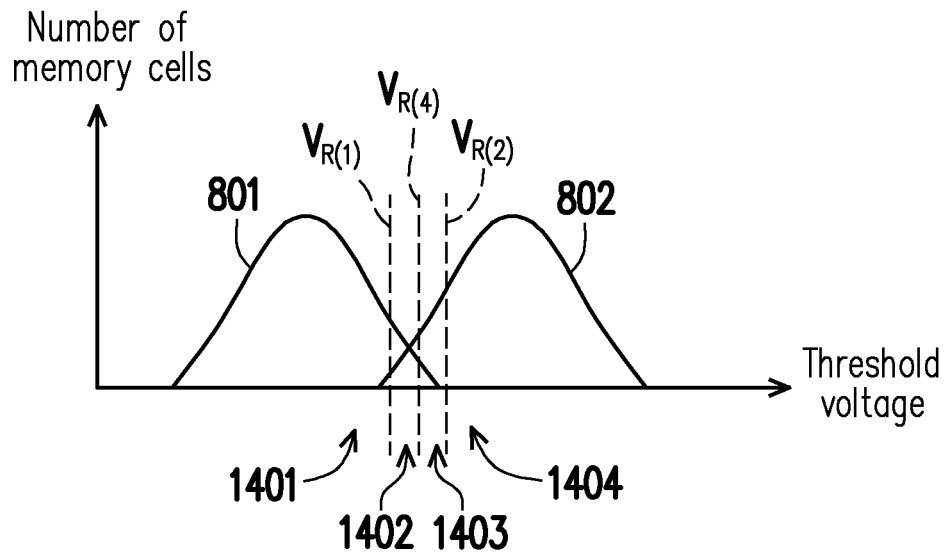
FIG. 14 is a schematic diagram of identifying multiple voltage intervals according to read voltage levels used in hard bit mode decoding illustrated according to an exemplary embodiment of the present disclosure.

FIG. 14 is a schematic diagram of identifying multiple voltage intervals according to RVLs used in hard bit mode decoding illustrated according to an exemplary embodiment of the present disclosure. Referring to FIG. 14, in an exemplary embodiment, in response to the RVL $V_{R(4)}$ meeting the first condition, the MMC 502 may identify the voltage intervals 1401-1404 according to the RVLs $V_{R(1)}$ and $V_{R(2)}$ that have been used in the hard bit mode decoding. According to the reading results of the RVLs $V_{R(1)}$, $V_{R(2)}$ and $V_{R(4)}$, the threshold voltage of each memory cell in the first PU can be identified as belonging to one of the voltage ranges 1401-1404 and corresponding reliability information may be assigned to these memory cells. The assistance information may include the reliability information obtained at this time. Taking the LLR as an example of the reliability information, the value of the reliability information corresponding to the voltage interval to the left may be smaller. Then, according to the voltage interval to which each memory cell belongs, the EDCC 508 can use the corresponding reliability information (that is, the assistance information) to decode the data read from these memory cells by the RVL $V_{R(4)}$.

In an exemplary embodiment, it is assumed that the data read by the RVL $V_{R(1)}$ is third data, the data read by the RVL $V_{R(2)}$ is first data, and the data read by the RVL $V_{R(4)}$ is second data. The MMC 502 can determine the reliability information corresponding to the voltage interval 1402 according to a difference value between the syndrome value of the third data and the syndrome value of the second data and a difference value between the RVL $V_{R(1)}$ and the RVL $V_{R(4)}$. For example, the MMC 502 may determine the reliability information corresponding to the voltage interval 1402 according to the following equation (1.1).

$$LLR(1402)=\alpha \times (DIF(A)/DIF(B))\beta \times DIF(A)\gamma \times DIF(B)C \quad (1.1)$$

Among them, DIF (A) corresponds to the difference value between the syndrome value of the third data and the syndrome value of the second data, and DIF (B) corresponds to the difference value between the RVL $V_{R(1)}$ and the RVL $V_{R(4)}$. $\alpha$, $\beta$, $\gamma$ and C are all constants. Similarly, the MMC 502 can determine the reliability information corresponding to the voltage interval 1403 according to a difference value between the syndrome value of the second data and the syndrome value of the first data and a difference value between the RVL $V_{R(4)}$ and the RVL $V_{R(2)}$. For example, in an exemplary embodiment, the reliability information corresponding to the voltage intervals 1401-1404 can be determined as "−1", "−0.2", "0.4", and "1", respectively.

Figure 15:
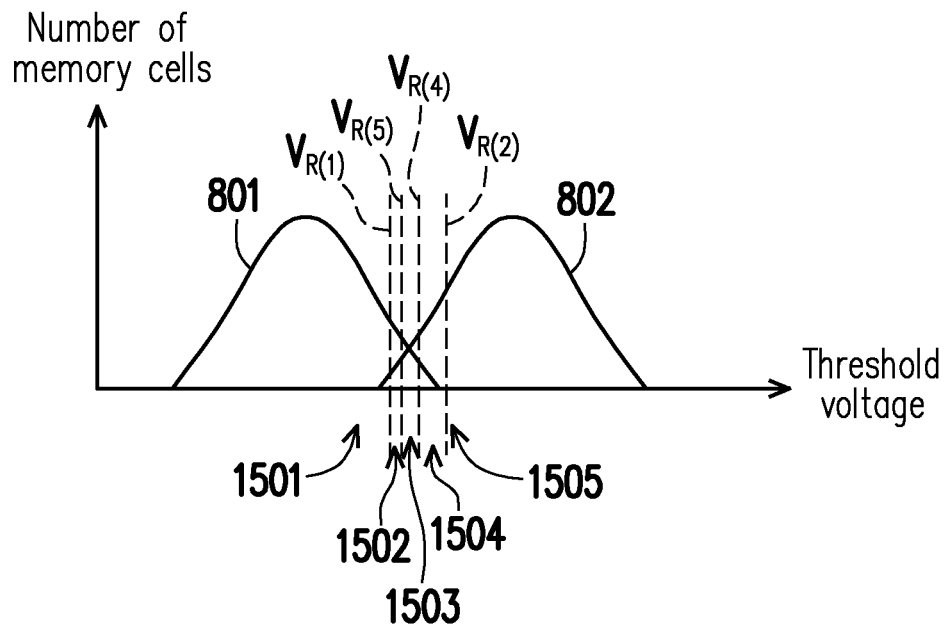
FIG. 15 is a schematic diagram of identifying multiple voltage intervals according to read voltage levels used in hard bit mode decoding illustrated according to an exemplary embodiment of the present disclosure.

FIG. 15 is a schematic diagram of identifying multiple voltage intervals according to RVLs used in hard bit mode decoding illustrated according to an exemplary embodiment of the present disclosure. Please refer to FIG. 15, following the example embodiment of FIG. 14, if the decoding of data read by RVL $V_{R(4)}$ still fails, the RVL $V_{R(5)}$ can be further used to read the first PU.

In an exemplary embodiment, in response to the RVL $V_{R(5)}$ meeting the first condition, the MMC 502 may identify the voltage intervals 1501-1505 according to the RVLs $V_{R(1)}$, $V_{R(2)}$, $V_{R(4)}$ and $V_{R(5)}$ already used in the hard bit mode decoding.

According to the reading results of the RVLs $V_{R(1)}$, $V_{R(2)}$, $V_{R(4)}$ and $V_{R(5)}$, the threshold voltage of each memory cell in the first PU can be identified as belonging to one of the voltage intervals 1501-1505 and the corresponding reliability information may be given. The assistance information may include the reliability information obtained at this time. Then, according to the voltage interval to which each memory cell belongs, the EDCC 508 can use the corresponding reliability information (that is, the assistance information) to decode the data read from these memory cells by the RVL $V_{R(5)}$.

In an exemplary embodiment, the MMC 502 may both consider whether the second RVL meets the first condition and the second data meets the second condition to determine whether to use assistance information to decode the second data. In an exemplary embodiment, the MMC 502 may also determine whether to use assistance information to decode the second data based only on whether the second RVL meets the first condition or based only on whether the second data meets the second condition, depending on practical requirements.

In the foregoing exemplary embodiment, data reading of one single RVL is taken as an example for description. However, in the following exemplary embodiments, data reading of multiple RVLs is used as an example for description.

Figure 16:
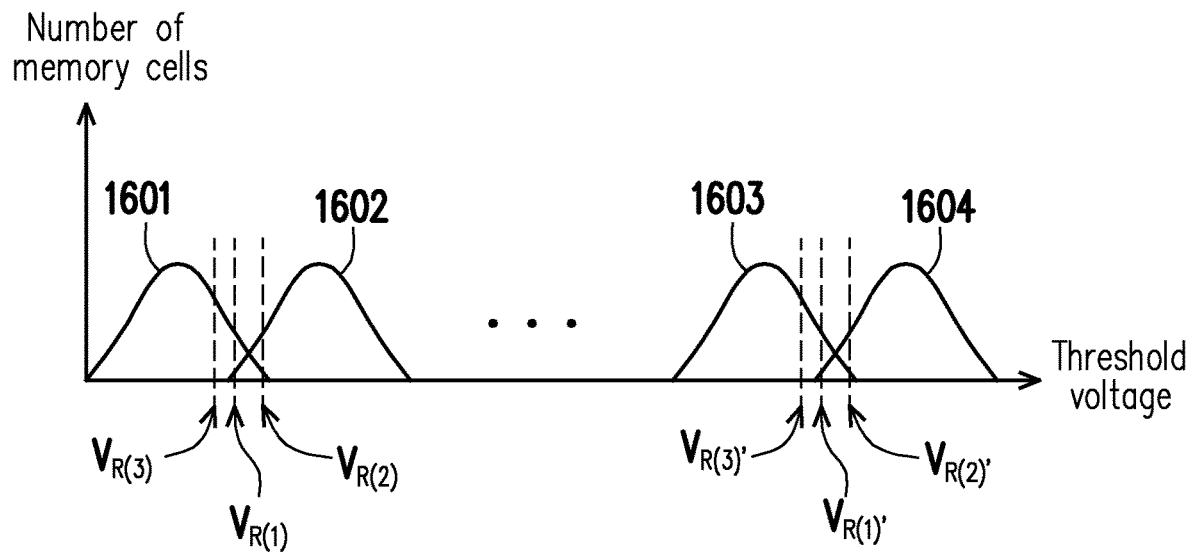
FIG. 16 is a schematic diagram of threshold voltage distribution and read voltage levels used in hard bit mode decoding illustrated according to an exemplary embodiment of the present disclosure.

FIG. 16 is a schematic diagram of threshold voltage distribution and RVLs used in hard bit mode decoding illustrated according to an exemplary embodiment of the present disclosure. Referring to FIG. 16, it is assumed that the threshold voltage distribution of the programmed memory cells in the first PU includes states 1601-1604. States 1601 are adjacent to 1602, and states 1603 are adjacent to 1604. In the hard bit mode decoding, the RVLs $V_{R(1)}$ and $V_{R(1)'}$, the RVLs $V_{R(2)}$ and $V_{R(2)'}$ or the RVLs $V_{R(3)}$ and $V_{R(3)'}$ can be applied to the first PU at the same time to read the corresponding data. For example, the RVLs $V_{R(1)}$ and $V_{R(1)'}$, the RVLs $V_{R(2)}$ and $V_{R(2)'}$ or the RVLs $V_{R(3)}$ and $V_{R(3)'}$ can correspond to any two of the RVLs being applied at the same time in FIG. 7 (e.g., the RVLs V1 and V2).

In an exemplary embodiment, the MMC 502 may send a read command sequence which indicates reading of the first PU by using the RVLs $V_{R(1)}$ and $V_{R(1)'}$ to obtain data reflecting a reading result of the RVLs $V_{R(1)}$ and $V_{R(1)'}$. The EDCC 508 can decode this data. Assuming that the decoding of this data fails, the MMC 502 may send a read command sequence which indicates reading of the first PU by using the RVLs $V_{R(2)}$ and $V_{R(2)'}$ to obtain data reflecting a reading result of the RVLs $V_{R(2)}$ and $V_{R(2)'}$. The EDCC 508 can decode this data. Assuming that the decoding of this data fails, the MMC 502 may send a read command sequence which indicates reading of the first PU by using the RVLs $V_{R(3)}$ and $V_{R(3)'}$ to obtain data reflecting a reading result of the RVLs $V_{R(3)}$ and $V_{R(3)'}$.

Figure 17:
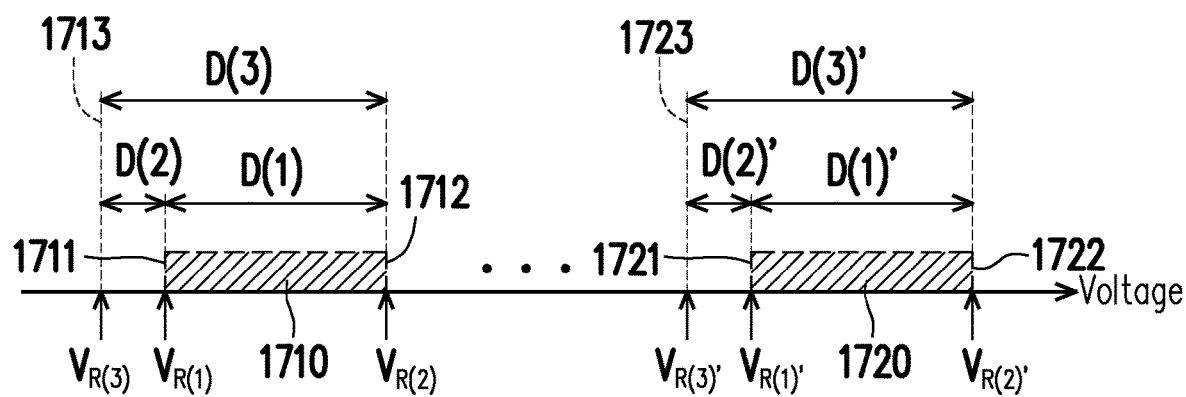
FIG. 17 is a schematic diagram of specific voltage range and read voltage levels illustrated according to an exemplary embodiment of the present disclosure.

FIG. 17 is a schematic diagram of specific voltage range and RVLs illustrated according to an exemplary embodiment of the present disclosure. Please refer to FIGS. 16 and 17, in an exemplary embodiment, the MMC 502 may determine a specific voltage range 1710 according to the RVLs $V_{R(1)}$ and $V_{R(2)}$ and determine a specific voltage range 1720 according to the RVLs $V_{R(1)'}$ and $V_{R(2)'}$.

As shown in FIG. 17, the RVLs $V_{R(3)}$ and $V_{R(3)'}$ are not in the specific voltage ranges 1710 and 1720 respectively, so MMC 502 can determine that RVLs $V_{R(3)}$ and $V_{R(3)'}$ do not meet the first condition. In response to the RVLs $V_{R(3)}$ and $V_{R(3)'}$ not meeting the first condition, when decoding the data reflecting the read result of the RVLs $V_{R(3)}$ and $V_{R(3)'}$, the EDCC 508 will not use the assistance information.

On the other hand, the MMC 502 can determine whether to update the boundary of the specific voltage ranges 1710 and 1720 according to the relative relationship between the RVLs $V_{R(3)}$ and $V_{R(3)'}$ and the specific voltage ranges 1710 and 1720. In an exemplary embodiment, the MMC 502 may determine whether to update the boundary of the specific voltage ranges 1710 and 1720 according to whether the RVLs $V_{R(3)}$ and $V_{R(3)'}$ are within the specific voltage ranges 1710 and 1720, respectively. For related operations, reference may be made to the exemplary embodiment of FIG. 13, and details are not repeated here.

In an exemplary embodiment, the MMC 502 can obtain a difference value D(1) between the RVLs $V_{R(1)}$ and $V_{R(2)}$ and a difference value D(1)' between the RVLs $V_{R(1)'}$ and $V_{R(2)'}$. The MMC 502 can obtain a difference value D(2) between the RVLs $V_{R(1)}$ and $V_{R(3)}$ and a difference value D(2)' between the RVLs $V_{R(1)'}$ and $V_{R(3)'}$. The MMC 502 can determine whether the sum of the difference values D(2) and D(2)' is greater than the sum of the difference values D(1) and D(1)'. If the sum of the difference values D(2) and D(2)' is greater than the sum of the difference values D(1) and D(1)', the MMC 502 can update a boundary 1712 of the specific voltage range 1710 according to the RVL $V_{R(3)}$ and update a boundary 1722 of the specific voltage range 1720 according to the RVL $V_{R(3)'}$.

The MMC 502 can obtain a difference value D(3) between the RVLs $V_{R(2)}$ and $V_{R(3)}$ and a difference value D(3)' between the RVLs $V_{R(2)'}$ and $V_{R(3)'}$. The MMC 502 can determine whether the sum of the difference values D(3) and D(3)' is greater than the sum of the difference values D(1) and D(1)'. If the sum of the difference values D(3) and D(3)' is greater than the sum of the difference values D(1) and D(1)', the MMC 502 can update a boundary 1711 of the specific voltage range 1710 according to the RVL $V_{R(3)}$ and update a boundary 1721 of the specific voltage range 1720 according to the RVL $V_{R(3)'}$.

As shown in FIG. 17, the sum of the difference values D(2) and D(2)' is not greater than the sum of the difference values D(1) and D(1)' and the sum of the difference values D(3) and D(3)' is greater than the sum of the difference values D(1) and D(1)', so the MMC 502 can update the boundary 1711 of the specific voltage range 1710 according to the RVL $V_{R(3)}$ and update the boundary 1721 of the specific voltage range 1720 according to the RVL $V_{R(3)'}$. For example, the MMC 502 may update the left boundary of the specific voltage range 1710 from the boundary 1711 corresponding to the RVL $V_{R(1)}$ to the boundary 1713 corresponding to the RVL $V_{R(3)}$, so as to expand the coverage of the specific voltage range 1710. At the same time, the MMC 502 may update the left boundary of the specific voltage range 1720 from the boundary 1721 corresponding to the RVL $V_{R(1)'}$ to the boundary 1723 corresponding to the RVL $V_{R(3)'}$, so as to expand the coverage of the specific voltage range 1720.

Figure 18:
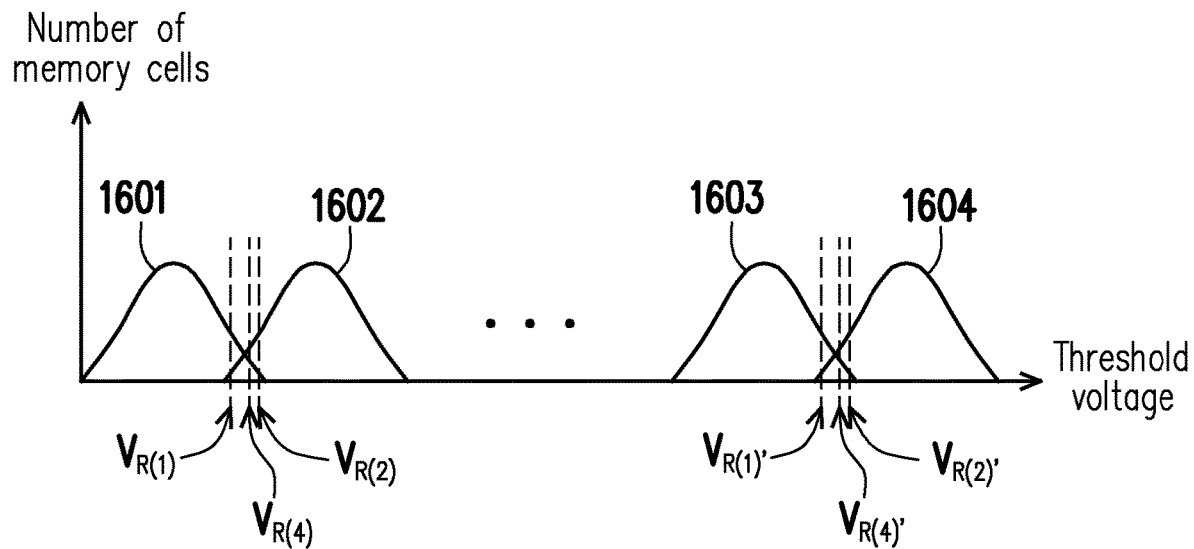
FIG. 18 is a schematic diagram of threshold voltage distribution and read voltage levels used in hard bit mode decoding illustrated according to an exemplary embodiment of the present disclosure.
Figure 19:
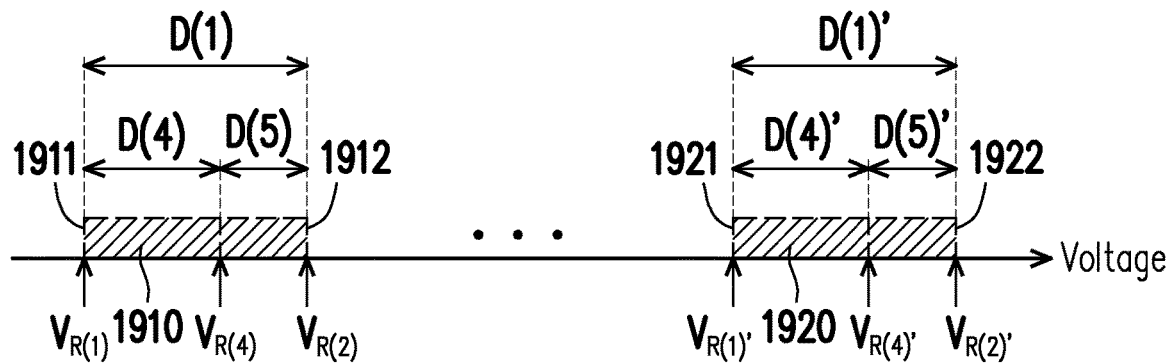
FIG. 19 is a schematic diagram of specific voltage range and read voltage levels illustrated according to an exemplary embodiment of the present disclosure.

FIG. 18 is a schematic diagram of threshold voltage distribution and RVLs used in hard bit mode decoding illustrated according to an exemplary embodiment of the present disclosure. FIG. 19 is a schematic diagram of specific voltage range and RVLs illustrated according to an exemplary embodiment of the present disclosure. Please refer to FIGS. 18 and 19, compared with the example embodiments of FIGS. 16 and 17, in the example embodiments of FIGS. 18 and 19, the RVLs $V_{R(3)}$ and $V_{R(3)'}$ are replaced with the RVLs $V_{R(4)}$ and $V_{R(4)'}$ respectively. For example, the RVLs $V_{R(4)}$ and $V_{R(4)'}$ may correspond to any two RVLs (such as RVLs V1 and V2) that can be applied simultaneously in FIG. 7.

As shown in FIG. 19, the RVLs $V_{R(4)}$ and $V_{R(4)'}$ are within specific voltage ranges 1910 and 1920 respectively, so MMC 502 can determine that the RVLs $V_{R(4)}$ and $V_{R(4)'}$ match the first condition. In response to the RVL $V_{R(4)}$ and $V_{R(4)'}$ meeting the first condition, the EDCC 508 may use assistance information to decode the data reflecting the reading result of the RVLs $V_{R(4)}$ and $V_{R(4)'}$. How to use the assistance information to perform the decoding operation in hard bit mode decoding has been detailed above, and will not be repeated here.

On the other hand, the MMC 502 can determine whether to update the boundary of the specific voltage ranges 1910 and 1920 according to the relative relationship between the RVLs $V_{R(4)}$ and $V_{R(4)'}$ and the specific voltage ranges 1910 and 1920. In an exemplary embodiment, the MMC 502 may determine whether to update the boundary of the specific voltage ranges 1910 and 1920 according to whether the RVLs $V_{R(4)}$ and $V_{R(4)'}$ are within the specific voltage ranges 1910 and 1920, respectively. For related operations, reference may be made to the exemplary embodiment of FIG. 13, and details are not repeated here.

In an exemplary embodiment, the MMC 502 can obtain a difference value D(4) between the RVLs $V_{R(1)}$ and $V_{R(4)}$ and a difference value D(4)' between the RVLs $V_{R(1)'}$ and $V_{R(4)'}$. The MMC 502 can determine whether the sum of the difference values D(4) and D(4)' is greater than the sum of the difference values D(1) and D(1)'. If the sum of the difference values D(4) and D(4)' is greater than the sum of the difference values D(1) and D(1)', the MMC 502 can update a boundary 1912 of the specific voltage range 1910 according to the RVL $V_{R(4)}$ and update a boundary 1922 of the specific voltage range 1920 according to the RVL $V_{R(4)'}$.

The MMC 502 can obtain a difference value D(5) between the RVLs $V_{R(2)}$ and $V_{R(4)}$ and a difference value D(5)' between the RVLs $V_{R(2)'}$ and $V_{R(4)'}$. The MMC 502 can determine whether the sum of the difference values D(5) and D(5)' is greater than the sum of the difference values D(1) and D(1)'. If the sum of the difference values D(5) and D(5)' is greater than the sum of the difference values D(1) and D(1)', the MMC 502 can update a boundary 1911 of the specific voltage range 1910 according to the RVL $V_{R(4)}$ and update a boundary 1921 of the specific voltage range 1920 according to the RVL $V_{R(4)'}$.

As shown in FIG. 19, the sum of the difference values D(4) and D(4)' is not greater than the sum of the difference values D(1) and D(1)' and the sum of the difference values D(5) and D(5)' is also not greater than the sum of the difference values D(1) and D(1)', so the MMC 502 may not update the specific voltage ranges 1910 and 1920, to prevent the decreasing of the coverage of the specific voltage ranges 1910 and 1920.

Figure 20:
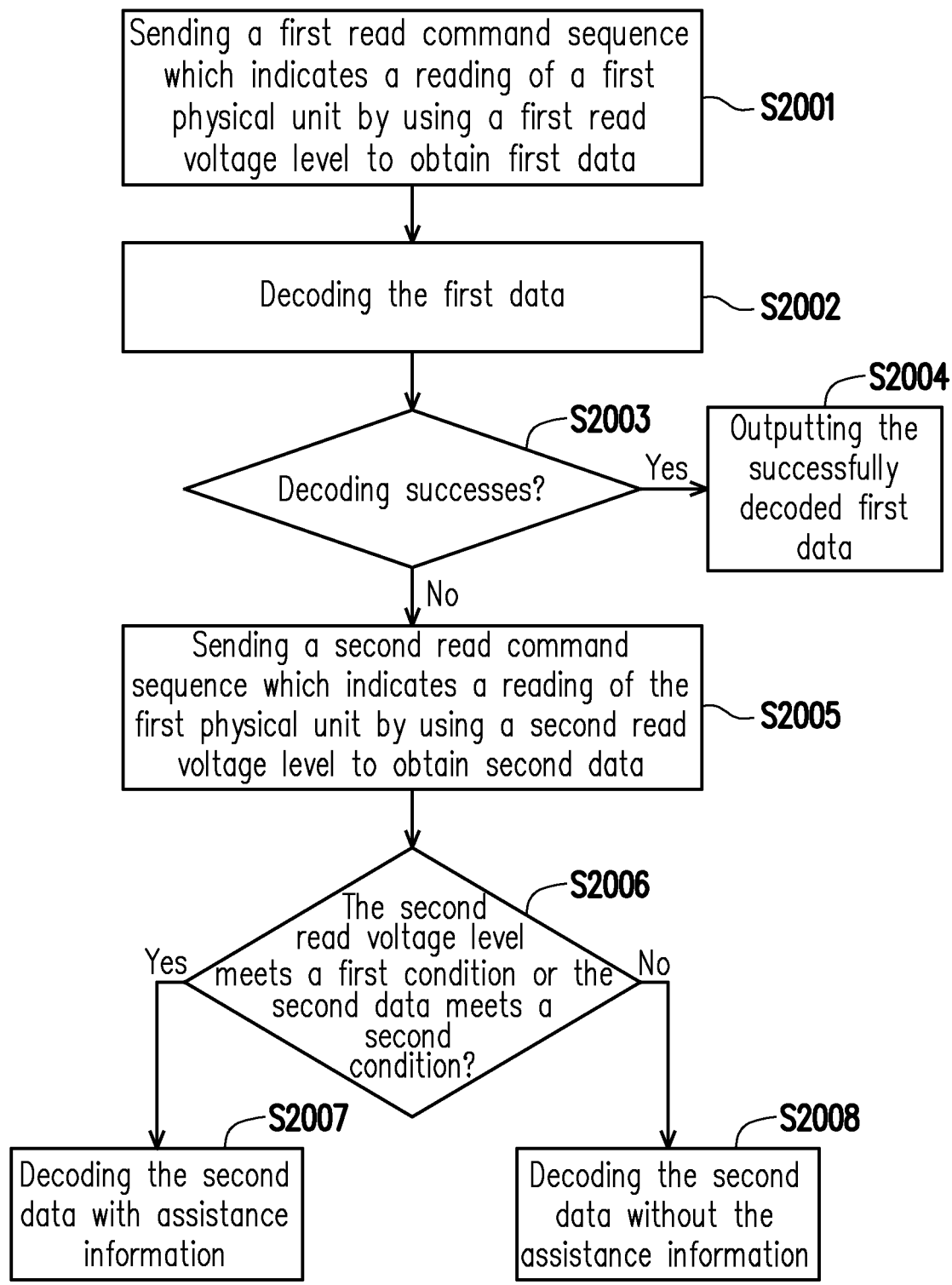
FIG. 20 is a flowchart of memory control method illustrated according to an exemplary embodiment of the present disclosure.

FIG. 20 is a flowchart of memory control method illustrated according to an exemplary embodiment of the present disclosure. Referring to FIG. 20, at step S2001, a first read command sequence which indicates a reading of a first PU by using a first RVL to obtain first data is sent. At step S2002, the first data is decoded. At step S2003, whether the first data is successfully decoded is determined. If the first data is successfully decoded, at step S2004, the successfully decoded first data is output. If the first data is not successfully decoded, at step S2005, a second read command sequence which indicates a reading of the first PU by using a second RVL to obtain second data is sent. The second RVL is different from the first RVL.

At step S2006, it is determined whether the second RVL meets a first condition or the second data meets a second condition. If the second RVL meets the first condition or the second data meets the second condition, at step S2007, decoding the second data with the assistance information. If the second RVL does not meet the first condition and the second data does not meet the second condition, at step S2008, decoding the second data without the assistance information.

Figure 21:
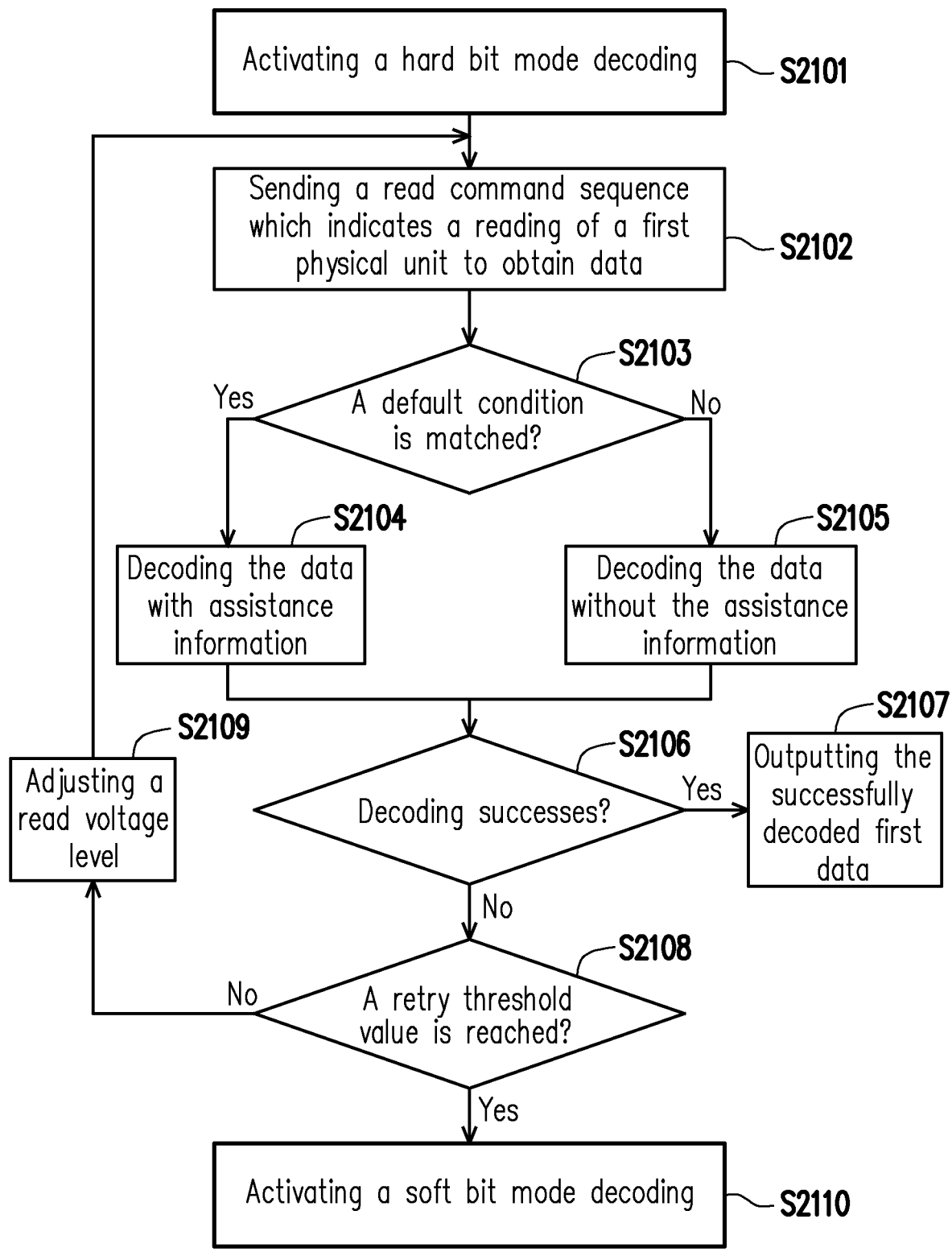
FIG. 21 is a flowchart of memory control method illustrated according to an exemplary embodiment of the present disclosure.

FIG. 21 is a flowchart of memory control method illustrated according to an exemplary embodiment of the present disclosure. Referring to FIG. 21, at step S2101, a hard bit mode decoding is activated. At step S2102, a read command sequence which indicates a reading of a first PU by using a RVL to obtain data is sent. The data may reflect a reading result of the used RVL applied to the first PU. At step S2103, it is determined whether a default condition being matched or satisfied. For example, the default condition may include that the used RVL meets a first condition and/or the read data meets a second condition. If the used RVL meets the first condition and/or the read data meets the second condition, it may be determined that the default condition is matched or satisfied. If the used RVL does not meet the first condition and the read data does not meet the second condition, it may be determined that the default condition is not matched or not satisfied.

If the default condition is matched or satisfied, at step S2104, the read data is decoded with the assistance information. The assistance information is configured to increase or improved the decoding success rate of the read data. If the default condition is not matched or not satisfied, at step S2105, the read data is decoded without the assistance information. At step S2106, it is determined whether the decoding is successful. If the decoding is successful, at step S2107, the successfully decoded data is output. If the decoding is not successful, at step S2108, it is determined whether a retry count of the decoding reaches a retry threshold value. If the retry count of the decoding does not reach the retry threshold value, at step S2109, the RVL used next time is adjusted and back to step S2102, the first PU is read again by the adjusted RVL. If the retry count of the decoding reaches the retry threshold value, at step S2110, the hard bit mode decoding is leaved and a soft bit mode decoding is activated.

However, the steps in FIGS. 20 and 21 have been described in detail as above, and will not be repeated here. It should be noted that the steps in FIG. 20 and FIG. 21 can be implemented as multiple codes or circuits, and the invention is not limited thereto. In addition, the methods of FIG. 20 and FIG. 21 can be used in conjunction with the above exemplary embodiments or can be used alone, and the invention is not limited thereto.

In summary, in hard bit mode decoding, after reading the first PU at least once and experiencing at least one decoding failure, the assistance information that can increase the decoding success rate of data is only used when certain conditions are met (or not used in each rereading and decoding without any limitation). In this way, on the premise of trying to increase the decoding success rate of data in hard bit mode decoding, it can avoid reducing the decoding success rate due to excessive use or adjustment of the assistance information.

The previously described exemplary embodiments of the present disclosure have the advantages aforementioned, wherein the advantages aforementioned not required in all versions of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory control method for a rewritable non-volatile memory module, wherein the rewritable non-volatile memory module comprises a plurality of physical units, and the memory control method comprises:
   sending a first read command sequence which indicates a reading of a first physical unit among the physical units by using a first read voltage level to obtain first data;
   decoding the first data;
   sending a second read command sequence which indicates a reading of the first physical unit by using a second read voltage level to obtain second data if a decoding of the first data is failed, wherein the second read voltage level is different from the first read voltage level;
   decoding the second data with assistance information to improve a decoding success rate of the second data if the second read voltage level meets a first condition or the second data meets a second condition; and
   decoding the second data without the assistance information if the second read voltage level does not meet the first condition and the second data does not meet the second condition.

2. The memory control method according to claim 1, further comprises:
   determining whether the second read voltage level meets the first condition according to whether the second read voltage level is within a specific voltage range.

3. The memory control method according to claim 1, further comprises:
   obtaining a syndrome value of the second data, wherein the syndrome value is related to a bit error rate of the second data; and
   determining whether the second data meets the second condition according to whether the syndrome value is less than a default value.

4. The memory control method according to claim 1, further comprises:
   sending a third read command sequence which indicates a reading of the first physical unit by using a third read voltage level to obtain third data before the first read command sequence is sent;
   decoding the third data; and
   determining a specific voltage range according to the first read voltage level and the third read voltage level, wherein one of the first read voltage level and the third read voltage level is configured to determine an upper boundary of the specific voltage range, and the other one of the first read voltage level and the third read voltage level is configured to determine a lower boundary of the specific voltage range.

5. The memory control method according to claim 4, further comprises:
   updating a boundary of the specific voltage range according to the second read voltage level.

6. The memory control method according to claim 5, wherein the step of updating the boundary of the specific voltage range according to the second read voltage level comprises:
   determining whether to update the boundary of the specific voltage range according to a relative relationship between the second read voltage level and the specific voltage range.

7. The memory control method according to claim 1, further comprises:
   identifying a plurality of voltage intervals according to the first read voltage level and the second read voltage level if the second read voltage level meets the first condition or the second data meets the second condition; and determining the assistance information according to the identified voltage intervals.

8. A memory storage device, comprising:
a connection interface unit, configured to be coupled to a host system;
a rewritable non-volatile memory module which comprises a plurality of physical units; and
a memory control circuit unit, coupled to the connection interface unit and the rewritable non-volatile memory module,
wherein the memory control circuit unit is configured to send a first read command sequence which indicates a reading of a first physical unit among the physical units by using a first read voltage level to obtain first data,
the memory control circuit unit is further configured to decode the first data,
the memory control circuit unit is further configured to send a second read command sequence which indicates a reading of the first physical unit by using a second read voltage level to obtain second data if a decoding of the first data is failed, wherein the second read voltage level is different from the first read voltage level,
the memory control circuit unit is further configured to decode the second data with assistance information to improve a decoding success rate of the second data if the second read voltage level meets a first condition or the second data meets a second condition, and
the memory control circuit unit is further configured to decode the second data without the assistance information if the second read voltage level does not meet the first condition and the second data does not meet the second condition.

9. The memory storage device according to claim 8, wherein the memory control circuit unit is further configured to determine whether the second read voltage level meets the first condition according to whether the second read voltage level is within a specific voltage range.

10. The memory storage device according to claim 8, wherein the memory control circuit unit is further configured to obtain a syndrome value of the second data, the syndrome value is related to a bit error rate of the second data, and
the memory control circuit unit is further configured to determine whether the second data meets the second condition according to whether the syndrome value is less than a default value.

11. The memory storage device according to claim 8, wherein the memory control circuit unit is further configured to send a third read command sequence which indicates a reading of the first physical unit by using a third read voltage level to obtain third data before the first read command sequence is sent,
the memory control circuit unit is further configured to decode the third data, and
the memory control circuit unit is further configured to determine a specific voltage range according to the first read voltage level and the third read voltage level, wherein one of the first read voltage level and the third read voltage level is configured to determine an upper boundary of the specific voltage range, and the other one of the first read voltage level and the third read voltage level is configured to determine a lower boundary of the specific voltage range.

12. The memory storage device according to claim 11, wherein the memory control circuit unit is further configured to update a boundary of the specific voltage range according to the second read voltage level.

13. The memory storage device according to claim 12, wherein the operation of updating the boundary of the specific voltage range according to the second read voltage level comprises:
determining whether to update the boundary of the specific voltage range according to a relative relationship between the second read voltage level and the specific voltage range.

14. The memory storage device according to claim 8, wherein the memory control circuit unit is further configured to identify a plurality of voltage intervals according to the first read voltage level and the second read voltage level if the second read voltage level meets the first condition or the second data meets the second condition, and
the memory control circuit unit is further configured to determine the assistance information according to the identified voltage intervals.

15. A memory control circuit unit for controlling a memory storage device, wherein the memory storage device comprises a rewritable non-volatile memory module, the rewritable non-volatile memory module comprises a plurality of physical units, and the memory control circuit unit comprises:
a host interface, configured to be coupled to a host system;
a memory interface, configured to be coupled to the rewritable non-volatile memory module;
a decoding circuit; and
a memory management circuit, coupled to the host interface, the memory interface and the decoding circuit,
wherein the memory management circuit is configured to send a first read command sequence which indicates a reading of a first physical unit among the physical units by using a first read voltage level to obtain first data,
the decoding circuit is configured to decode the first data,
the memory management circuit is further configured to send a second read command sequence which indicates a reading of the first physical unit by using a second read voltage level to obtain second data if a decoding of the first data is failed, wherein the second read voltage level is different from the first read voltage level,
the decoding circuit is further configured to decode the second data with assistance information to improve a decoding success rate of the second data if the second read voltage level meets a first condition or the second data meets a second condition, and
the decoding circuit is further configured to decode the second data without the assistance information if the second read voltage level does not meet the first condition and the second data does not meet the second condition.

16. The memory control circuit unit according to claim 15, wherein the memory management circuit is further configured to determine whether the second read voltage level meets the first condition according to whether the second read voltage level is within a specific voltage range.

17. The memory control circuit unit according to claim 15, wherein the memory management circuit is further configured to obtain a syndrome value of the second data, the syndrome value is related to a bit error rate of the second data, and the memory management circuit is further configured to determine whether the second data meets the second condition according to whether the syndrome value is less than a default value.

18. The memory control circuit unit according to claim 15, wherein the memory management circuit is further configured to send a third read command sequence which indicates a reading of the first physical unit by using a third read voltage level to obtain third data before the first read command sequence is sent, the decoding circuit is further configured to decode the third data, and the memory management circuit is further configured to determine a specific voltage range according to the first read voltage level and the third read voltage level, wherein one of the first read voltage level and the third read voltage level is configured to determine an upper boundary of the specific voltage range, and the other one of the first read voltage level and the third read voltage level is configured to determine a lower boundary of the specific voltage range.

19. The memory control circuit unit according to claim 18, wherein the memory management circuit is further configured to update a boundary of the specific voltage range according to the second read voltage level.

20. The memory control circuit unit according to claim 19, wherein the operation of updating the boundary of the specific voltage range according to the second read voltage level comprises:

determining whether to update the boundary of the specific voltage range according to a relative relationship between the second read voltage level and the specific voltage range.

21. The memory control circuit unit according to claim 15, wherein the memory management circuit is further configured to identify a plurality of voltage intervals according to the first read voltage level and the second read voltage level if the second read voltage level meets the first condition or the second data meets the second condition, and the memory management circuit is further configured to determine the assistance information according to the identified voltage intervals.

* * * * *